(12) United States Patent
Sarin et al.

(10) Patent No.: US 7,633,798 B2
(45) Date of Patent: Dec. 15, 2009

(54) M+N BIT PROGRAMMING AND M+L BIT READ FOR M BIT MEMORY CELLS

(75) Inventors: Vishal Sarin, Cupertino, CA (US);
Jung-Sheng Hoei, Fremont, CA (US);
Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 11/943,916

(22) Filed: Nov. 21, 2007

(65) Prior Publication Data

US 2009/0129153 A1 May 21, 2009

(51) Int. Cl.
*G11C 16/04* (2006.01)
(52) U.S. Cl. .............................. 365/185.03; 365/185.21; 365/185.24; 365/185.11
(58) Field of Classification Search ............ 365/185.03, 365/185.21, 185.24, 185.11
See application file for complete search history.

(56) References Cited

U.S. PATENT DOCUMENTS

| | | | |
|---|---|---|---|
| 5,737,265 A * | 4/1998 | Atwood et al. ......... | 365/185.03 |
| 7,221,592 B2 | 5/2007 | Nazarian | |
| 2006/0004952 A1 | 1/2006 | Lasser | |
| 2006/0285392 A1 | 12/2006 | Incarnati et al. | |
| 2008/0062760 A1 * | 3/2008 | Kim ....................... | 365/185.03 |

* cited by examiner

*Primary Examiner*—Thong Q Le
(74) *Attorney, Agent, or Firm*—Leffert Jay & Polglaze, P.A.

(57) ABSTRACT

A memory device and programming and/or reading process is described that programs and/or reads the cells in the memory array with higher threshold voltage resolution than required. In programming non-volatile memory cells, this allows a more accurate threshold voltage placement during programming and enables pre-compensation for program disturb, increasing the accuracy of any subsequent read or verify operation on the cell. In reading/sensing memory cells, the increased threshold voltage resolution allows more accurate interpretations of the programmed state of the memory cell and also enables more effective use of probabilistic data encoding techniques such as convolutional code, partial response maximum likelihood (PRML), low-density parity check (LDPC), Turbo, and Trellis modulation encoding and/or decoding, reducing the overall error rate of the memory.

25 Claims, 9 Drawing Sheets

US 7,633,798 B2

M+N BIT PROGRAMMING AND M+L BIT READ FOR M BIT MEMORY CELLS

TECHNICAL FIELD

The present disclosure relates generally to semiconductor memory, and in particular, the present disclosure relates to solid state non-volatile memory devices and systems utilizing analog signals to communicate data values of two or more bits of information.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes (e.g., floating gates or trapping layers or other physical phenomena), determine the data value state of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
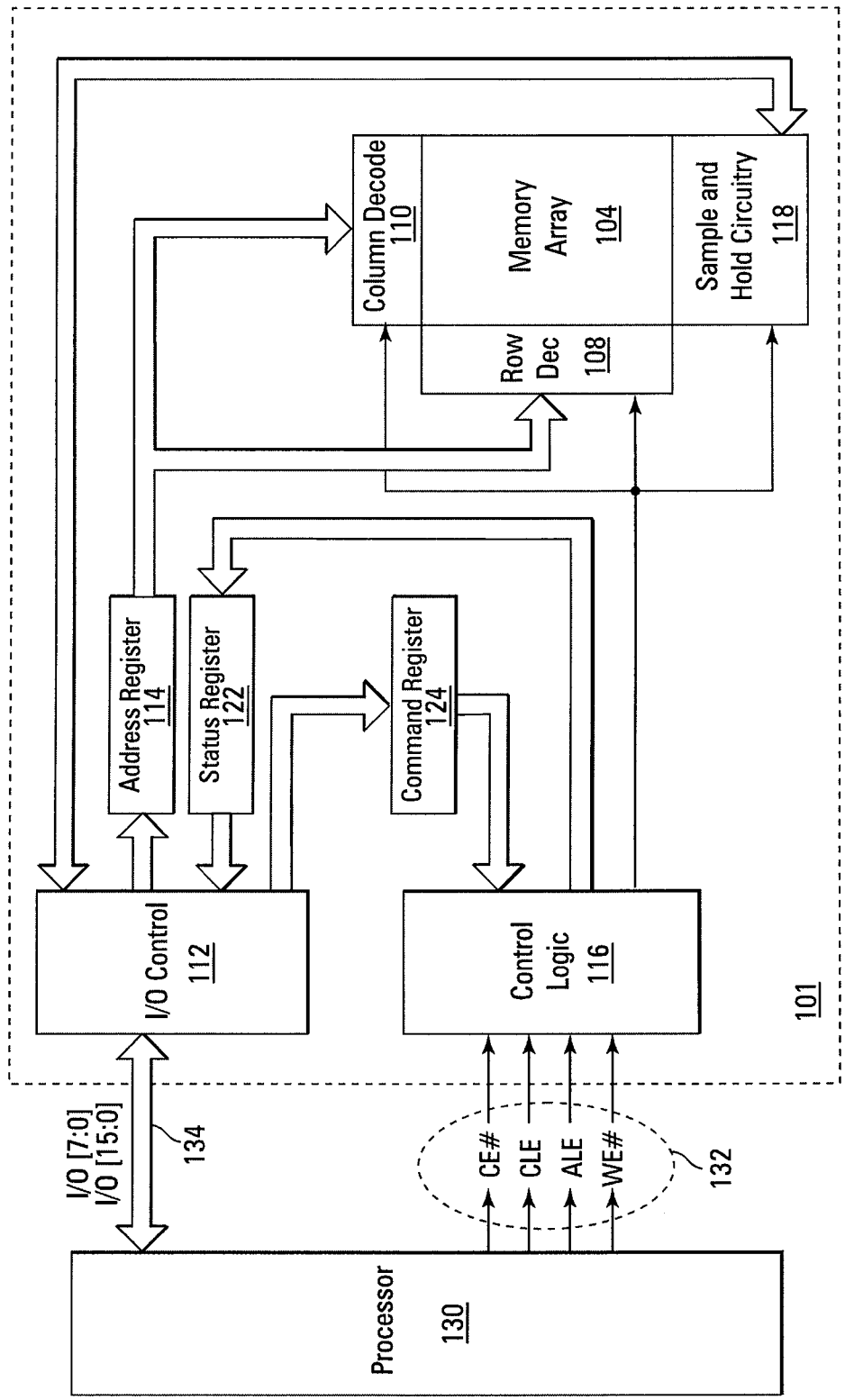
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values or bit patterns. Typically, a dead space or margin of 0.2V to 0.4V is between each range to keep the Vt distributions from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
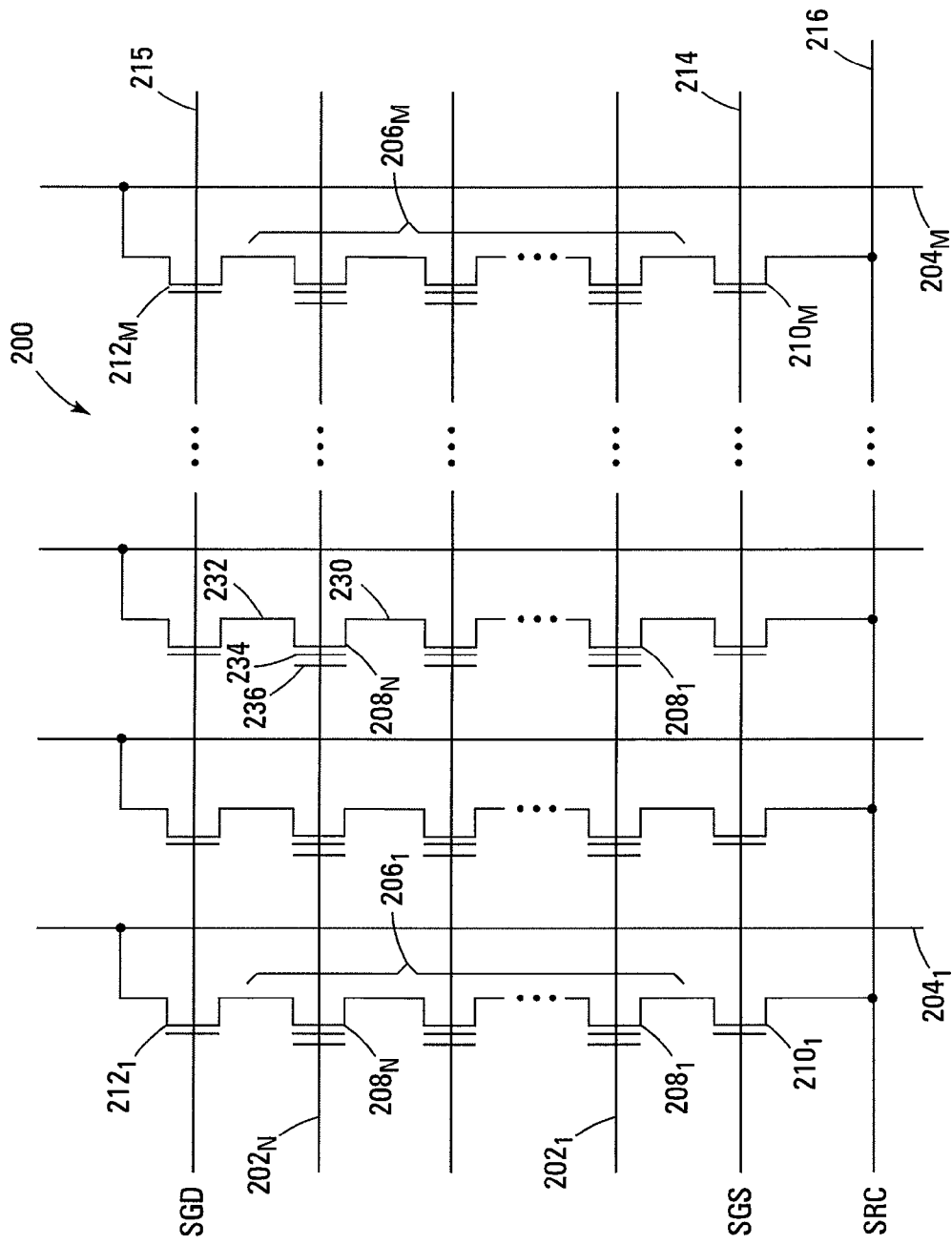
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
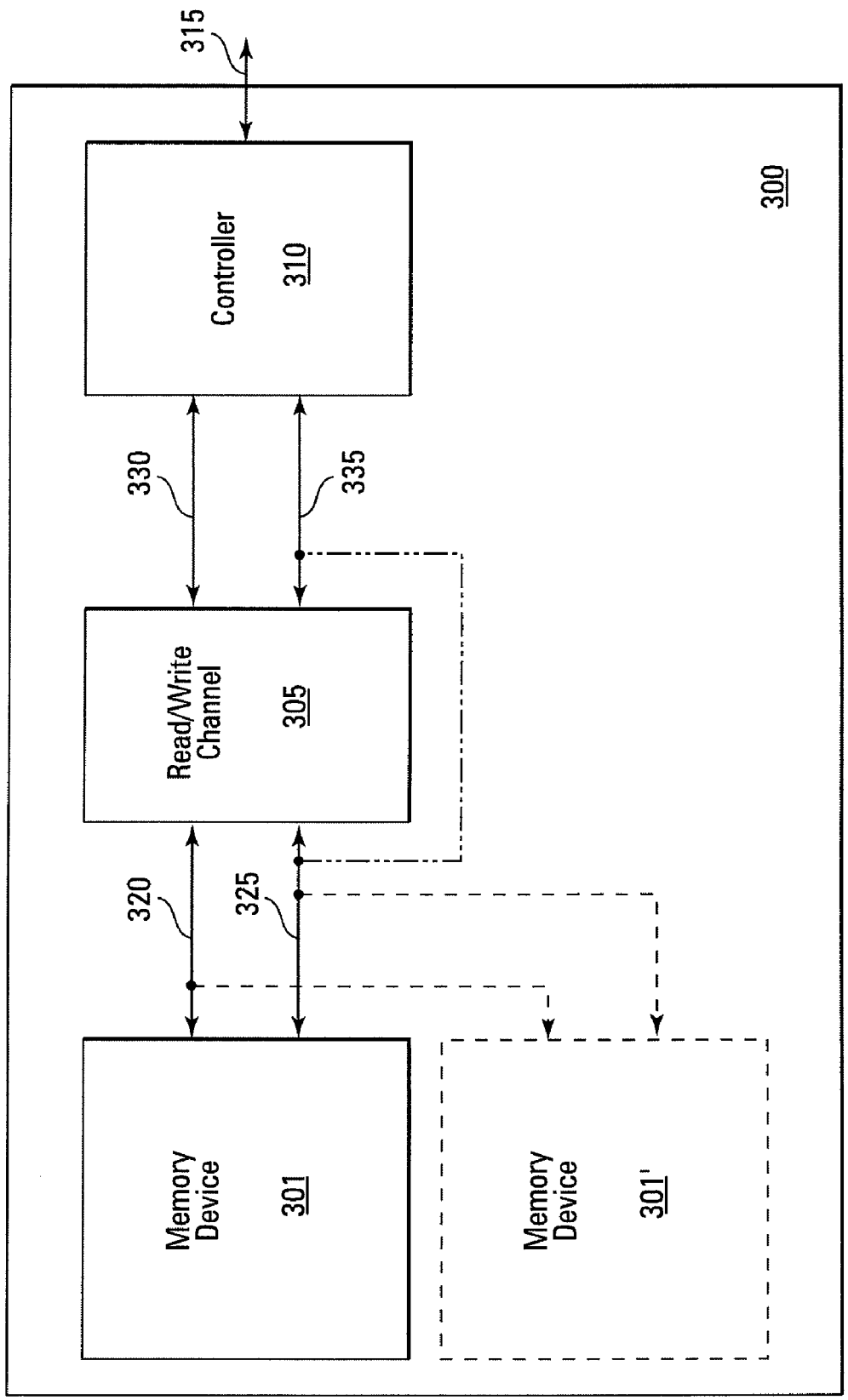
FIG. 3 is a block schematic of a solid state bulk storage device in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
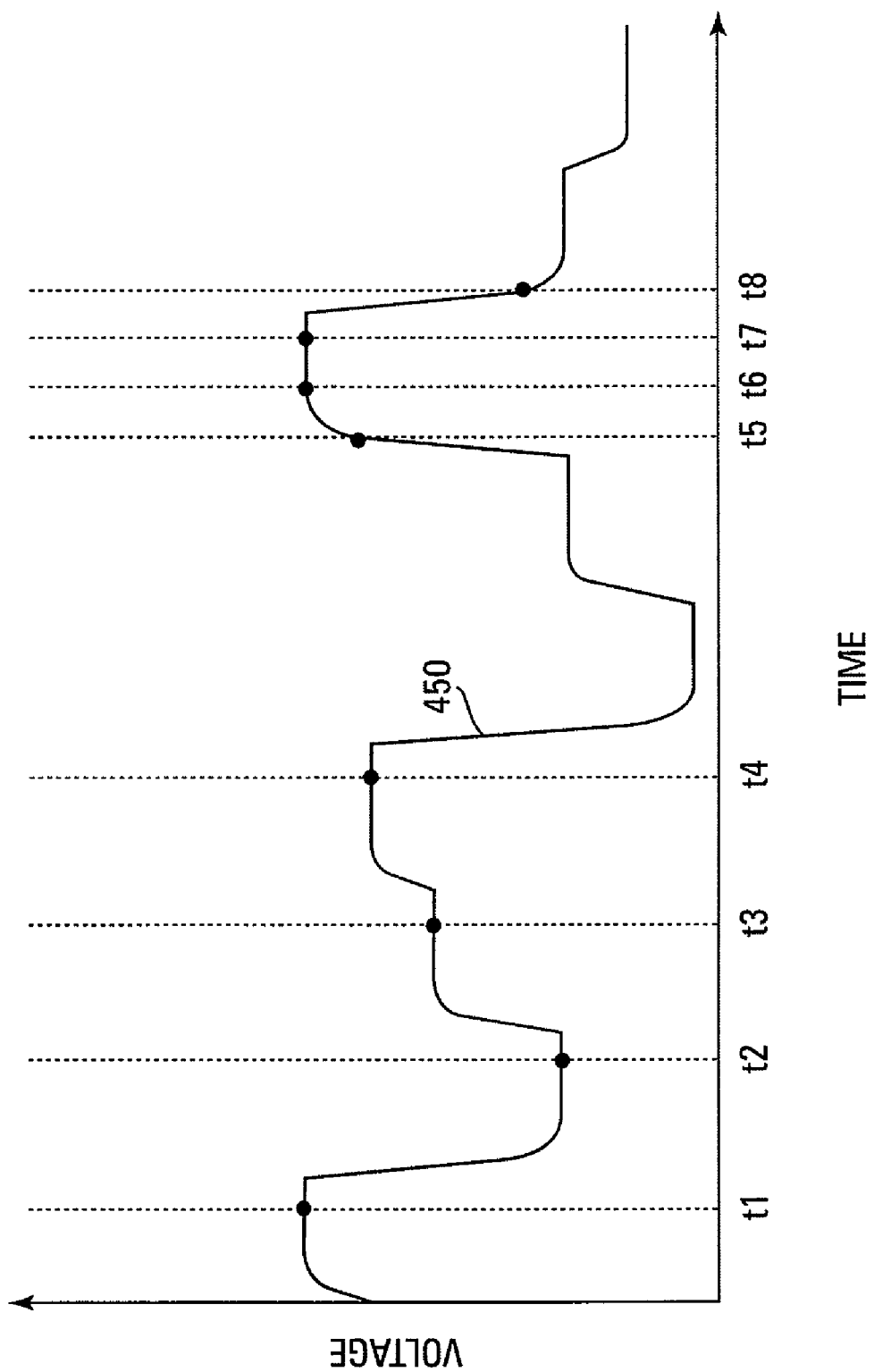
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
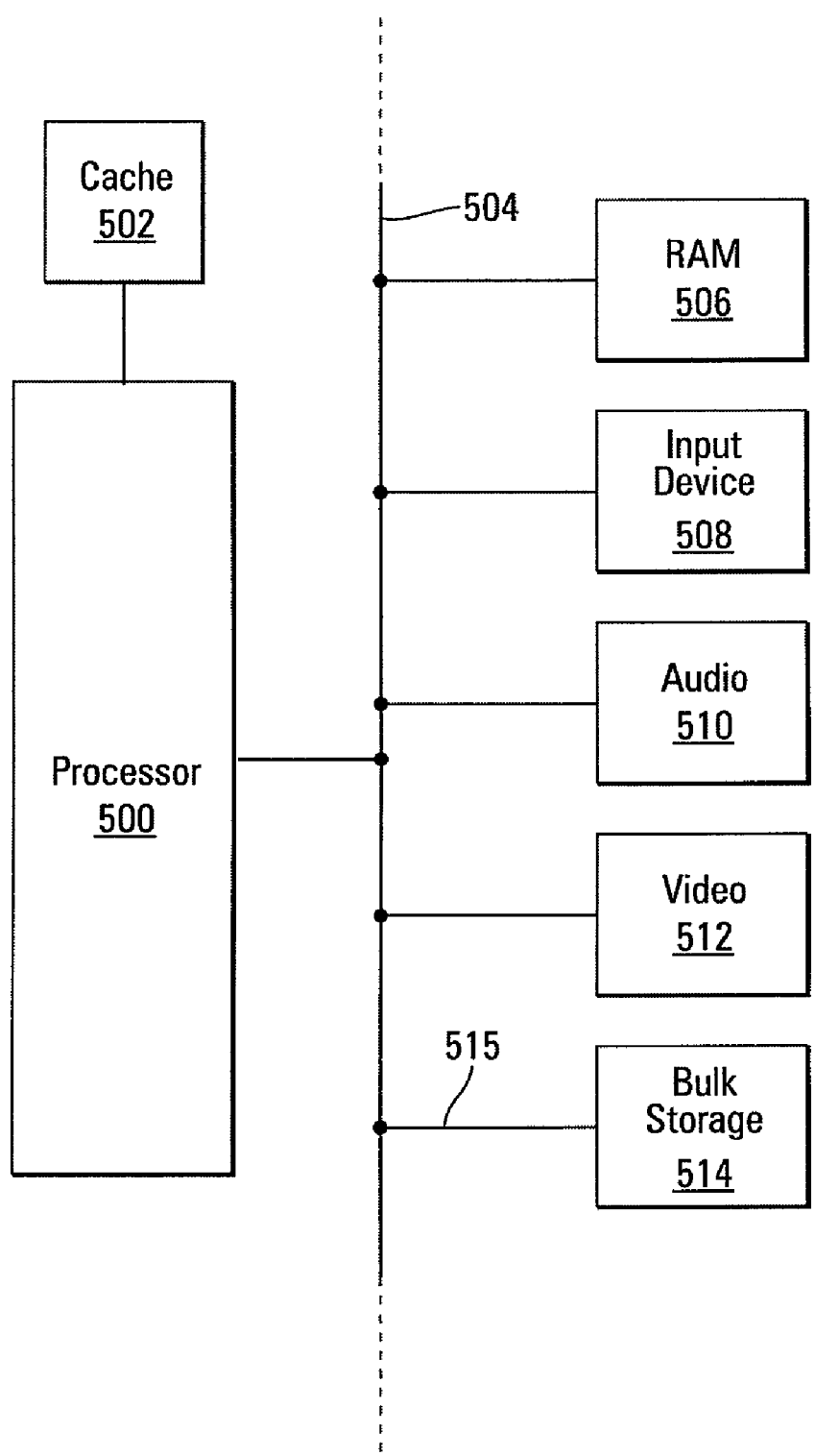
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

M+N Bit Programming and M+L Bit Read for M Bit Memory Cells

Threshold voltages of non-volatile memory cells in memories, including those in multi-level cells and systems such as those described above, are typically assigned in ranges (which are also known as "logic windows", windows, Vt distributions, threshold voltage levels, or threshold states) to indicate stored values. As stated above, typically, a buffer of dead space or margin (also known herein as margin, dead space, buffer, buffer margin, buffer areas, or buffer zones) is placed between each range to keep the Vt distributions of the logic windows from overlapping. These ranges/logic windows are typically referred to in operation of the memory by the data value it represents and/or the nominal threshold voltage level assigned to the range/Vt distribution. For example, as detailed in FIG. 6A, an exemplary two bit-per-cell MLC memory has four logic windows of 200 mV defined in each cell to represent the 11, 01, 10 and 00 states with a 200 mV to 400 mV buffer area between the states. In this exemplary memory, the Vt range corresponding to the 10 logic state is assigned to the 0.8V to 1.0V range and has a nominal threshold voltage level of 0.9V. The nominal threshold voltage for a given Vt logic window is typically utilized as the target voltage level to be gained in programming the memory cell to that logic state (yet is typically not achieved exactly due to cell variations and programming over/undershoot). In reading or sensing a non-volatile memory cell (e.g., as part of a read or verify operation), the sensed threshold voltage of the memory cell is matched in to one of the threshold voltage ranges defined by the logic windows (and the corresponding nominal threshold voltage/logic state) to allow the state of the memory cell to be interpreted as digital data and then manipulated or transferred from the memory device.

Many factors limit the effective number of states/logic windows modern non-volatile memories can reliably store and retrieve, such as the limited threshold voltage range achievable in non-volatile memory devices and non-volatile memory cell processes, the likelihood of programmed threshold voltage inaccuracy and programming/read disturb for the memory cell (generally related to memory cell characteristics, including feature size and process), and the requirement for placing a separating buffer between logic windows (that may also vary in size due to memory cell programming inaccuracy, Vt disturb and cell characteristics). Because of this only a limited number of threshold voltage ranges/logic windows can be physically defined in a given cell and still be reliably programmed and read, regardless if the memory and related circuits may be able to program and read at a higher voltage resolution. This limited number of logic windows for a given memory device, cell, and process technology is typically further restricted by the practice of storing binary values in each cell, thereby further limiting the number of usable logic windows to the closest power of two (2, 4, 8, 16, 32, or 64 logic windows to represent 1, 2, 4, 5, or 6 bits, respectively, in each cell) below the physical window limit.

Figure 6A:
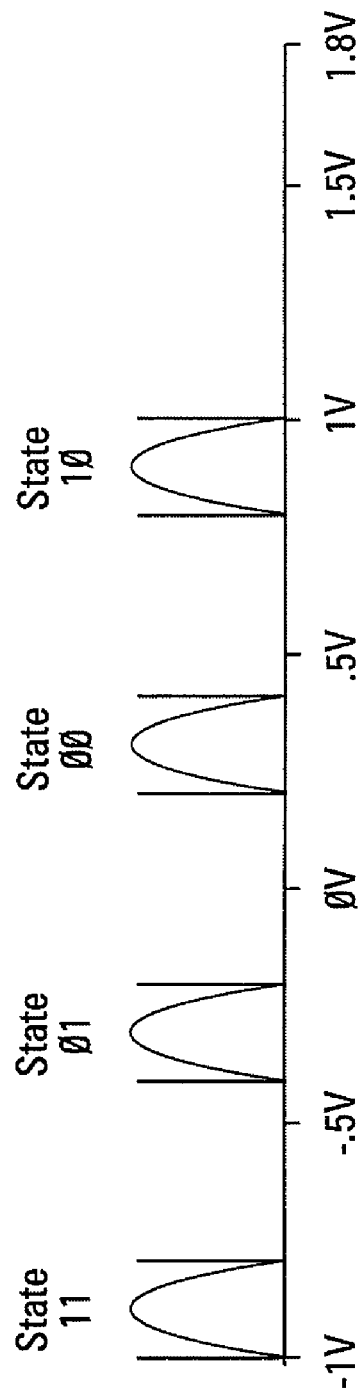
FIGS. 6A-6B detail diagrams detailing threshold voltage logic window states of non-volatile memory cells in accordance with embodiments of the present invention.
Figure 6B:
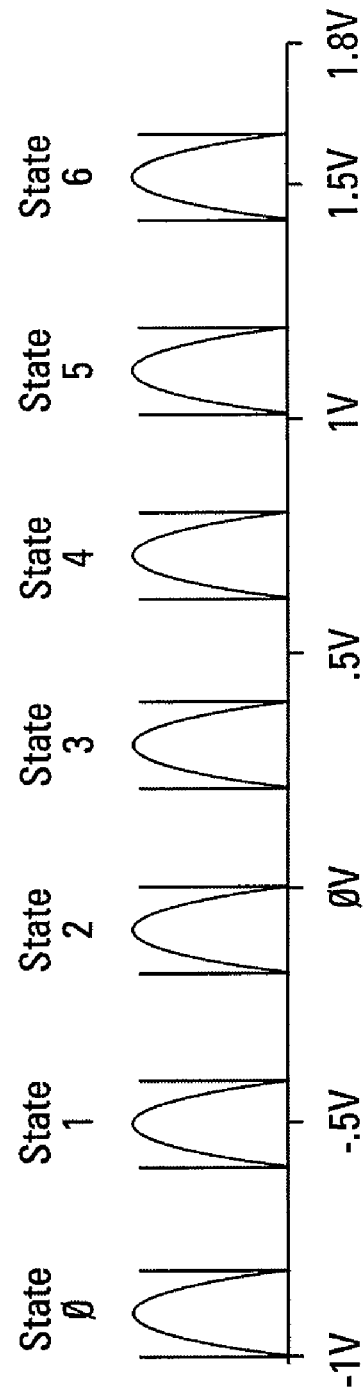

For example, in FIG. 6A, in a memory cell having a useable threshold voltage range of −1.0V to 1.8V, four states are defined ($2^2$ states, storing 2 bits in each cell), each having a logic window/range of 200 mV with a 400 mV buffer between adjacent state ranges. State 11 (erased) is defined to be from −1V to −0.8V, State 01 from −0.4V to −0.2V, State 00 from 0.2V to 0.4V, and State 10 from: 0.8V to 1.0V. However, as the memory cells of the array have a usable threshold voltage range of −1.0V to 1.8V with a minimum usable logic windows/ranges of 200 mV and a minimum buffer between ranges of 200 mV, up to seven states are possible, as detailed in FIG. 6B (States 0 to 6—State 0: −1V to −0.8V, State 1: −0.6V to −0.4V, State 2: −0.2V to 0V, State 3: 0.2V to 0.4V, State 4: 0.6V to 0.8V, State 5: 1.0V to 1.2V, and State 6: 1.4V to 1.6V, leaving 200 mV (1.6V to 1.8V) left over as unutilized threshold voltage range).

Embodiments of the present invention program and/or read at higher accuracy levels (also referred to herein as increased voltage level resolutions or window voltage level granularities) using a higher number of program and/or sense ranges than the defined number of Vt ranges/logic windows of the cell used in storing its programmed state (e.g., the data states corresponding to the assigned number of data bits). This is to provide additional granularity and correlated information (so called soft bit or bits) during programming or reading of the cells so that a processor or controller, such as a digital signal processing (DSP) unit, may use various data codes and data encoding/decoding techniques such as low-density parity check (LDPC), Turbo, Trellis Code Modulation, PRML, etc to achieve as large a number of bits reliably stored per cell as possible for a given process technology. It is noted that, while the embodiments are described in relation to NAND architecture non-volatile memory arrays and devices utilizing digital and analog communication, it will be apparent to those skilled in the art that the concepts disclosed herein are applicable to other non-volatile memory array architectures and corresponding memory devices, including, but not limited to NOR arrays, AND arrays, OR arrays, and virtual ground arrays.

In programming and sensing (also known as reading) a non-volatile memory cell, embodiments of the present invention divide the usable threshold voltage range of the non-volatile memory cells into an increased number of ranges, yielding a programming and/or a read/sense voltage resolution (also known as programming or sensing granularity) for the memory device that is higher than required by the defined logic windows of the cell. It is noted that in some embodiments of the present invention this increased programming and/or sense voltage resolution may be higher than the maximum number of logic windows/threshold voltage ranges the memory cells can reliably store. It is also noted that programming operation resolution can differ from that of read/sense operation resolution. In one embodiment the programming operation voltage resolution is lower than the read operation voltage resolution, allowing for increased read accuracy and data read back/encoding. In another embodiment of the present invention the programming operation voltage resolution is higher than the read operation voltage resolution, allowing for increased programming accuracy and data disturb compensation, thereby increasing data storage stability and subsequent read back accuracy.

As stated above, during programming operations various embodiments of the present invention program at higher voltage resolutions than required, dividing the usable threshold voltage range of the non-volatile memory cell being programmed into a larger number of voltage ranges (also known as nominal voltage levels or voltage steps) than the defined number of logic window/threshold voltage states. This yields a programming voltage step resolution/granularity that is higher than required to program a selected data state into a defined logic window of the cell, allowing more accurate programming. This increased programming accuracy allows the programmed threshold voltage to be more accurately placed in the target threshold voltage range, enabling more reliable subsequent read and verify operations. In addition, the increased programming accuracy also allows for the programmed threshold voltage of the cell to be pre-biased against the predicted program disturb and coupling effects of the adjacent memory cells. In particular, where data is being written into multiple rows of the memory array and so the final programmed states of the adjacent memory cells are known. In this case, the threshold voltage programmed in to a given cell can be programmed at the increased programming voltage resolution to take into account the predicted coupling and disturb effects of the adjacent cells. In this manner, the resulting final programmed threshold voltage of the cell, after programming of the array section, will be within the intended logic window/state/threshold voltage range of the cell.

The programmed threshold voltage of memory cells in memories, including those in multi-level cells and systems as described above, can deteriorate in various ways and for various reasons. Program disturb is one of these many causes for threshold voltage deterioration. Program disturb happens when the programming of subsequent memory cells affect the programmed threshold voltage of a previously programmed memory cell. In some cases, particularly in modern memory cells with reduced feature sizes and smaller logic windows/threshold voltage ranges and buffer margins, program disturb can move the programmed threshold voltage of the cell to the extent such that it causes an error when read (such as when the cell threshold voltage is moved to be within the buffer margin between logic windows) or causes the cell to read as being in a different state altogether than that originally programmed.

One such method of predicting and compensating for program disturb of memory cells in NAND architecture non-volatile memory devices and arrays is detailed in U.S. patent application Ser. No. 12/136,546, titled "METHODS AND APPARATUS UTILIZING PREDICTED COUPLING EFFECT IN THE PROGRAMMING OF NON-VOLATILE MEMORY," filed Jun. 10, 2008, which is commonly assigned.

Program disturb is generally caused by capacitive coupling between adjacent cells and by large programming voltages applied to the adjacent (and inhibited) non-volatile memory cells that are coupled to common word lines, source lines, bit lines and substrate connections, as the selected memory cells. Generally speaking, in program disturb events subsequently-programmed memory cells will tend to pull up the threshold voltage of a prior-programmed neighboring memory cell. For example, non-volatile memory cells are typically erased, or brought to some initial threshold voltage, prior to programming to their desired threshold voltage. This initial threshold voltage is usually a negative voltage, e.g., −1V. Memory cells are then programmed in sequence to their desired threshold voltages (e.g., a target threshold voltage). Programming generally involves applying a series of programming pulses of increasing voltage to increase the charge stored on the floating gate, with each pulse generally followed by a verify operation to determine whether the memory cell has reached its desired threshold voltage. This usually occurs for a logical page of a word line, such as even or odd columns of that word line. As individual memory cells reach their desired threshold voltage, they are inhibited from further programming. Upon reaching the desired threshold voltages for all memory cells along a given page of a word line, programming is halted and the memory cells in the next page of the word line, or along a page of the next adjacent word line are then programmed. This process is repeated until memory cells along each word line of a column of memory cells are programmed.

As memory cells along a subsequent word line or in the adjacent columns are programmed, their increasing threshold voltages will increase the threshold voltage of prior programmed memory cells in prior word line as well as in adjacent columns due to floating gate to floating gate coupling effect. This will result in an increase of the threshold voltage of these prior-programmed memory cells. While this threshold voltage increase is small, it can hinder the ability to store increasing numbers of bits of data per memory cell. As memory cells are used to store more and more bits of data per cell, this coupling effect is becoming more troublesome as there is less room for such Vt drift as the Vt ranges associated with each bit pattern become more narrow and the margins between the Vt ranges also generally decrease. Thus, by predicting the coupling effect of subsequently-programmed memory cells, the coupling effect can be advantageously utilized to tighten the distribution of threshold voltages for a given bit pattern by reducing unexpected Vt drift, which can facilitate more discernable Vt ranges, and thus a higher number of bits of data per memory cell, and/or wider margins between Vt ranges, and thus increased reliability in reading the correct data value of a memory cell.

During program operations in various embodiments of the present invention the usable threshold voltage range of the non-volatile memory cells being programmed are divided into a larger number of voltage ranges (e.g., an increased resolution) than are required by the defined number of logic windows/states of the memory cell. This allows the programmed threshold voltage to be more accurately placed in the target threshold voltage range, enabling more reliable subsequent read and verify operations. For example, in the above detailed cell of FIG. 6B, the non-volatile memory cell has a usable threshold voltage range of −1V to 1.8V and stores 7 defined states/ranges/logic windows of 200 mV each, with 200 mV margins between the logic windows (State 0: −0.1V to −0.8V, State 1: −0.6V to −0.4V, State 2: −0.2V to 0V, State 3: 0.2V to 0.4V, State 4: 0.6V to 0.8V, State 5: 1.0V to 1.2V, and State 6: 1.4V to 1.6V). Program disturb events are predicted to move the programmed threshold voltage (Vt) of a cell 50 mV. As such, the programming resolution is selected to program the threshold voltage in 50 mV or smaller steps to allow for compensation of program disturb. E.g., allowing for programming the threshold voltage at 0.65V when a 50 mV program disturb is predicted in programming subsequent memory cells in order to place the final programmed threshold voltage of the cell in the center of the 0.6V to 0.8V range for State 4 (having a nominal threshold voltage of 0.7V).

In one exemplary embodiment of the present invention, the number of defined logic windows/states are a binary number ($2^M$, where M is the number of bits of user data being stored in the memory cell). A number of programming resolution threshold voltage ranges/states in the memory cell is also selected to be a binary number (utilizing $2^{M+N}$ threshold voltage ranges/states, where N is the number of extra bits utilized for programming data). It is noted, however, that the number of extra programming states and defined programmed threshold voltage logic windows do not have to be a binary number or represent a whole number of bits, as noted below. It is also noted that programming resolution can be effectively changed on the fly by masking off the resolution represented by the least significant/lower bits of the M+N programmed data (e.g., M+N−1 bits, M+N−2 bits, etc.). It is further noted that increased programming resolution and/or accuracy will generally come at the cost of a slower programming operation due to the increasingly finer threshold voltage steps in each programming cycle used to step the threshold voltage to the desired target.

In read, verify or sense operations, various embodiments of the present invention sense the threshold voltages of the selected memory cells at higher resolutions than required by the defined number of logic windows/threshold voltage ranges, yielding a sensed threshold voltage resolution (in nominal threshold voltage ranges) for the memory device that is higher than the defined number of logic windows/threshold voltage ranges/states of the cell. It is noted that the sensed threshold voltage ranges will typically also cross the buffer areas between the logic windows. This allows for increased read/sensing accuracy and proximity based error correction in situations where the threshold voltage has drifted out of the logic window. This allows the memory device to compensate for Vt drift and disturb in "near" or "guess" reads (e.g., allowing for a guess as to the correct programmed logic state of the cell that can be confirmed with a quick ECC code check, whereas before only a read error would be reported and a computationally intensive ECC error correction algorithm started to attempt to correct the error(s)). In addition, in one embodiment the increased read/sensing resolution enables the utilization of data encoding techniques in the programming of data that enhance data read back (increasing reliability and error compensation) when utilized in conjunction with the increased data read resolution of embodiments of the present invention. These data encoding techniques can include, but are not limited to, convolutional codes where additional granularity of information is used to make soft decisions and utilize probabilistic decoding techniques to achieve optimal decoding thereby reducing the overall error rate of the memory to reduce the overall error rate of the memory, partial response maximum likelihood (PRML), low-density parity check (LDPC), Turbo, and Trellis modulation encoding.

During read/sensing operations in various embodiments of the present invention, the usable threshold voltage range of the non-volatile memory cells being sensed are divided into a larger number of threshold voltage ranges than required by the defined number of logic windows/states of the memory cell. This increased sensing resolution allows the sensed threshold voltage to be accurately read and placed in a defined threshold voltage range, enabling more reliable read and/or verify operation. Utilizing the above example from programming, the non-volatile memory cell has a usable threshold voltage range of −1V to 1.8V and stores 5 defined states/logic windows of 400 mV each, with 200 mV margins between the logic windows (State 0: −1V to −0.6V, State 1: −0.4V to 0V, State 2: 0.2V to 0.6V, State 3: 0.8V to 1.2V, State 4: 1.4V to 1.8V). Disturb events are predicted to move the programmed threshold voltage (Vt) of a cell +/−50 mV within the logic window/range. As such, the programming resolution is selected to sense the threshold voltage utilizing a 25 mV or smaller resolution to allow for accurate threshold voltage read and possible error compensation/correction due to any threshold voltage drift.

In one embodiment of the present invention, the number of logic windows/states being read are a binary number ($2^M$, where M is the number of bits of user data stored in the memory cell), while the number of read resolution levels in the memory cell are also selected to be a binary number (utilizing $2^{M+L}$ digitization levels/voltage ranges, where L is the number of extra bits being utilized in sensing level data or read data). It is noted, however, as above that the number of extra sensing levels and the defined number of threshold voltage logic windows also do not have to be a binary number. It is also noted that increased read resolution and/or accuracy will generally come at the cost of a slower read/sensing operation due to the finer threshold voltage steps being read and increased signal settling times and that read resolution can be changed on the fly by selectively masking off the extra L bits of sensed threshold voltage data.

In one embodiment of the present invention, read operations utilize a higher resolution than a corresponding programming operation, enabling an increased amount of data to be available for processing when read. Thus, in binary implementation utilizing $2^{M+N}$ programming ranges/states and $2^{M+L}$ read digitization ranges/states, L will be greater than N.

Figure 7:
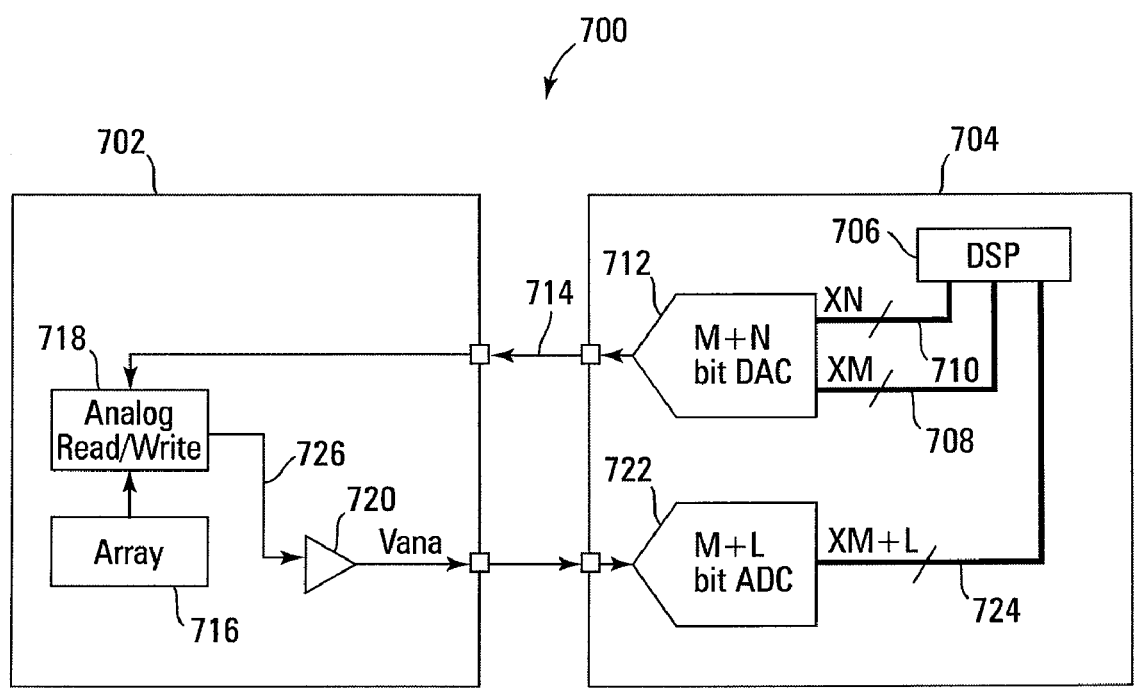
FIG. 7 is a block schematic of an electronic system in accordance with an embodiment of the disclosure utilizing analog data communication.

FIG. 7 details a simplified diagram of system 700 having an analog NAND architecture non-volatile memory device 702 of an embodiment of the present invention coupled to a memory controller 704. In FIG. 7, the data to be written to the non-volatile memory device 702 is processed by an internal digital signal processor (DSP) 706 of the controller 704, which outputs M bits of digital data 708 in combination with the N bits 710 of additional programming resolution for each selected memory cell to be written in the non-volatile memory device 702. This M+N bits 708, 710 of program data for each selected memory cell is then converted by a M+N bit digital to analog converter (DAC) 712 and output to the non-volatile memory device 702 as an analog data signal 714. Internal to the non-volatile memory device 702, the M+N bit analog data signal 714 is used to program a selected cell of the NAND architecture memory array 716 by the read/write circuitry 718 in a program operation.

Upon access one or more selected memory cells from the non-volatile memory device array 716 are sensed by the read/write circuitry 718. The sensed data 726 is then buffered 720 and transferred from the non-volatile memory device 702 to the coupled memory controller 704 as an analog signal. Within the memory controller 704, the analog data value signal is converted from analog to digital values with an analog to digital converter 722 and outputs at the elevated M+L bits of read resolution 724. This M+L bits of sensed threshold voltage read resolution for each cell is then coupled to the DSP 706 for processing and retrieval of the stored M bits of data from each memory cell.

It is noted that the analog signal bus 714 transferring the analog data signal from the controller 704 to the memory device 702 can have multiple possible forms, including, but not limited to parallel signal buses, serial signal buses, bi-directional signal buses, and unidirectional transmit and receive signal buses.

Program and read speed of various embodiments of the present invention can also be selected by trading off accuracy/resolution and the benefits derived thereby (program compensation, read encoding algorithm). For example, program speed can be increased by reducing the number of threshold voltage windows and/or changing the program operation voltage resolution to a coarser level, thereby reducing the total number of possible nominal threshold voltage program ranges (those increased number of voltage ranges above those needed to store the defined number of states/logic windows) and reducing the required accuracy of the programming operation (thereby reducing the potential number of programming cycles to fall within the voltage range defined by the target nominal voltage level being programmed). This reduces programming accuracy and the ability to compensate for program disturb (and thus the accuracy and reliability of any subsequent read operation), but will have the effect of speeding up the programming cycle by reducing the accuracy required. This will also have a follow on effect of reducing the corresponding read accuracy required.

Likewise, read speed can be increased by reducing the number of threshold voltage windows and/or changing the read operation voltage resolution to a coarser level, thereby reducing the total number of possible nominal threshold voltage read levels (those increased number of voltage steps read above those needed to read the data value stored in the defined number of states) and reducing the required accuracy of the read operation. This reduction in the extra number of possible read threshold voltage ranges/states (read threshold voltage resolution), in reducing the accuracy required, reduces the sensing time and the time required for the bit line to settle to a final voltage. However, this also reduces the ability to compensate for threshold window drift by guessing the correct state and reduces the effectiveness of the above listed encoding algorithms, but also reduces the required accuracy of the corresponding programming operation.

As detailed above in FIG. 7, various embodiments of the present invention include memory devices adapted to process and generate analog data signals representative of data values of the M+N programmed data values to store M bits of data in each cell. This is facilitated by storing data values as threshold voltage ranges on a non-volatile memory cell. Unlike the bit-by-bit programming operations of traditional multi-level cell technology, the various embodiments may program directly to a target threshold voltage for the desired bit pattern or data. Similarly, instead of reading individual bits, the various embodiments generate a data signal indicative of the threshold voltage of the target memory cell, and thus indicative of the M+L bits read from each cell, where M bits of data are stored in each cell.

It is noted that while various embodiments may receive and transmit the data signals as analog signals representative of bit patterns of two or more bits, they may also provide conversion internal to the memory device to an analog signal or selected threshold voltage range/state to permit receiving and transmitting digital signals representative of individual bits. It is also noted that in utilizing analog data signals, because a single analog data signal could represent two, four or more bits of information, data transfer rates may be increased along with memory density as each program or read operation is concurrently processing multiple bits per memory cell.

Figure 8:
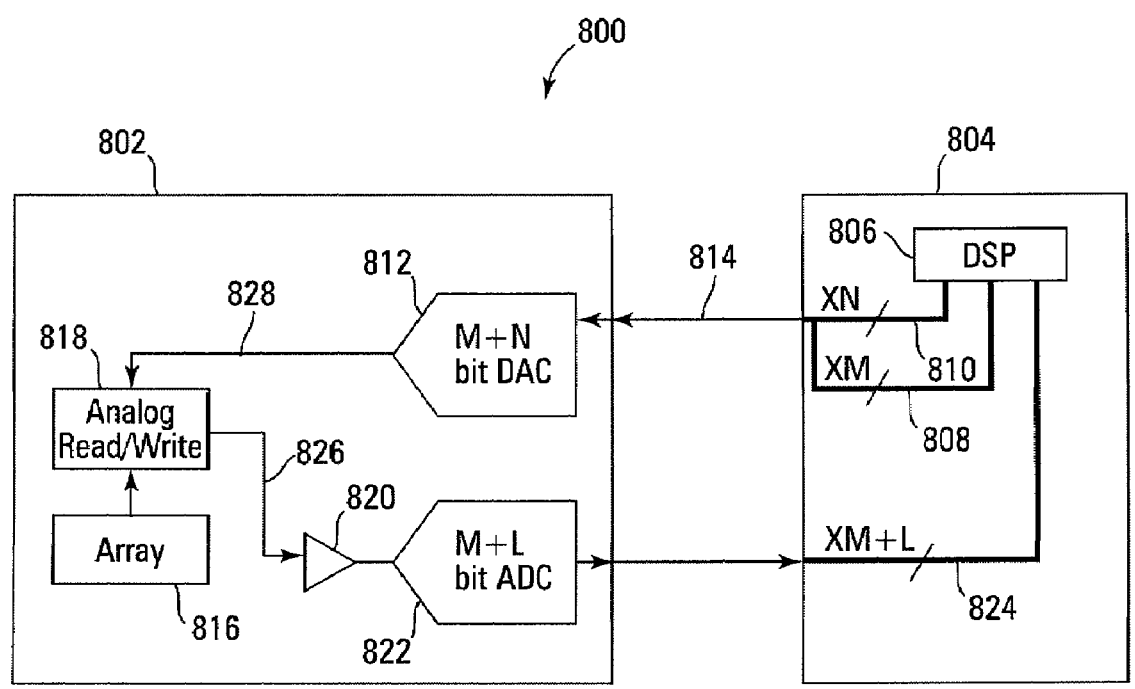
FIGS. 8 and 9 are block schematics of electronic systems in accordance with embodiments of the disclosure utilizing digital data communication.
Figure 9:
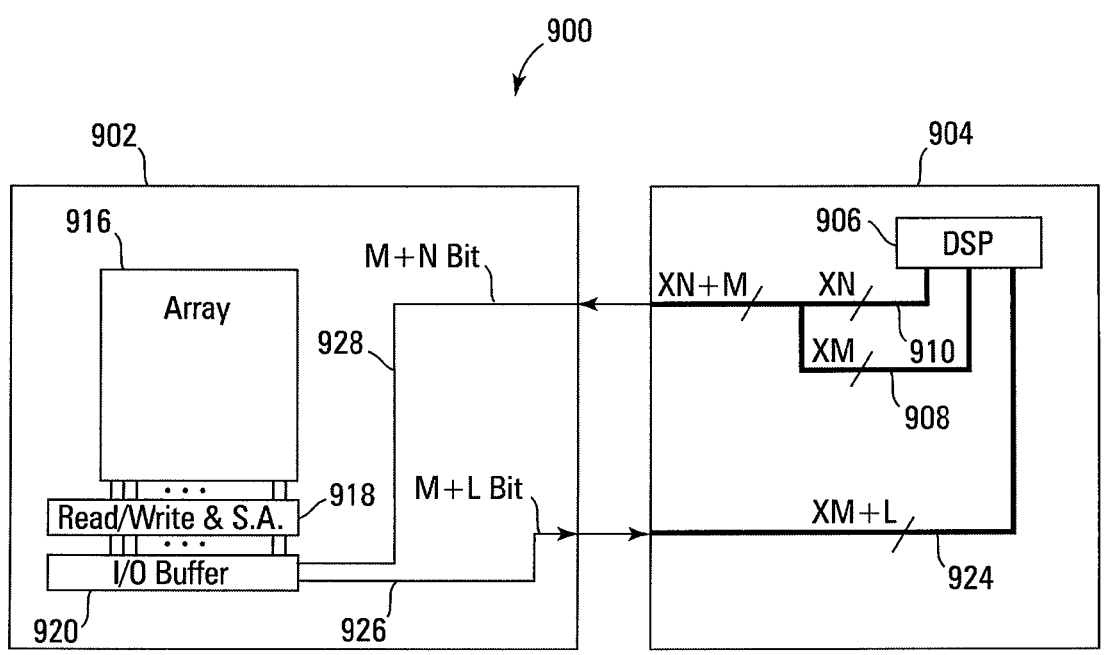

As detailed in FIGS. 8 and 9, other embodiments of the present invention also include memory devices adapted to receive and process digital data signals representative of the M+N programmed data values to store M bits of information in each cell. These digital data signals can then be utilized internal to the memory device to program threshold voltages in selected memory cells by either conversion to an analog threshold voltage representation or through direct selection of memory cell state defined by a threshold voltage range. In addition, in various embodiments of the present invention, the memory devices are adapted to generate and transmit digital data signals representative of the M+L bits read from each cell, where M bits of data are stored in each cell.

In FIG. 8, a simplified diagram of system 800 having a NAND architecture non-volatile memory device 802 of an embodiment of the present invention coupled to a memory controller 804 utilizing digital communication and internal analog conversion of the digital data. The data to be written to the non-volatile memory device 802 is processed by an internal digital signal processor (DSP) 806 of the controller 804, which outputs M bits of data 808 in combination with the N bits 810 of additional programming resolution for each selected memory cell to be written in the non-volatile memory device 802. This M+N bits 808, 810 of program data for each memory cell selected to be programmed is then transferred 814 as a digital representation to the memory device 802 and converted by a M+N bit digital to analog converter (DAC) 812 to an analog data signal 828 internally to the non-volatile memory device 802. The M+N bit analog data signal 828 is used to program one or more selected cells of the memory array 816 by the read/write circuitry 818 in a program operation.

Upon access one or more selected memory cells of the non-volatile memory device array 816 are sensed by the read/write circuitry 818. The sensed threshold voltage(s) 826 are then buffered 820, if required, and converted from analog to digital values with an analog to digital converter 822 of the non-volatile memory device 802 at the elevated M+L bits of read resolution. This M+L bits 824 of sensed threshold voltage read resolution for each cell is then transferred from the non-volatile memory device 802 to the coupled memory controller 804 and coupled to the DSP 806 for processing and retrieval of the M bits of data stored in each memory cell.

In FIG. 9, a simplified diagram of system 900 having a non-volatile memory device 902 of an embodiment of the present invention coupled to a memory controller 904 utilizing digital communication. The data to be written to the non-volatile memory device 902 is processed by an internal digital signal processor (DSP) 906 of the controller 904, which outputs M bits of data 908 in combination with the N bits 910 of additional programming resolution for each selected memory cell to be written in the non-volatile memory device 902. This M+N bits 908, 910 of program data for each memory cell selected to be programmed is then transferred across a bus 914 as a digital representation to the memory device 902. Internal to the memory device 902 the M+N bits 908, 910 of program data is programmed by the sense amplifier and read/write circuitry 918 in a program operation into the selected non-volatile memory cells of the memory array 916 utilizing a threshold logic window state and programming threshold voltage level directly selected by the input M+N bit digital data.

Upon access one or more selected memory cells from the non-volatile memory device array 916 are sensed by the read/write circuitry 918 and the sensed threshold voltage matched to a digital representation of the elevated read resolution. This sensing and matching of the threshold voltage to a digital representation can be accomplished by one of any of the above detailed methods, including, but not limited to, traditional multi-pass reading, ramped word line voltage reading, or source-follower reading. This digital representation of the sensed threshold voltage is then buffered in the I/O Buffer 920 and output 926 at the elevated M+L bits of read resolution from the non-volatile memory device 902. After transfer from the non-volatile memory device 902 to the coupled memory controller 904, this M+L bits 924 of sensed threshold voltage read resolution for each cell is coupled to the DSP 906 for processing and retrieval of the M bits of data stored in each memory cell.

It is noted that the digital bus 814, 914 transferring the digital data from the controller 804, 904 to the memory device 802, 902 of FIGS. 8 and 9 can have multiple possible forms, including, but not limited to parallel data buses, serial data buses, bi-directional data buses, and unidirectional data buses.

As stated above, memory cells typically are divided into a binary number of Vt ranges/logic windows, even though they can reliably store a greater number of distinct (non-binary) ranges/windows, to allow the cells to store one or more bits representing part of a range of binary numbers or bit pattern. Various embodiments of the present invention utilize a non-binary number of defined Vt voltage ranges/logic windows, up to the full number of reliably usable voltage ranges of the cell. In doing so these embodiments may also utilize the above detailed increased programming resolution and/or increased read/sensing resolution over and above that required to store the selected number of defined states in programming and reading the memory cells of the array.

In storing a non-binary number of defined states in each memory cell various embodiments of the present invention allow the storage of what is in effect a "fractional" number of binary states in each cell using a non-binary number of defined Vt ranges/logic windows of each cell. Previously, when storing one or more bits in a non-volatile memory cell, the binary number or bit pattern the bits represent is mapped into a binary number of states of each cell, even if the memory cell can reliably store more states. For example, storing a 6-bit binary number or pattern requires 64 possible states. Mapping this into 2-bit per cell MLC cells, 3 cells are required and each cell is programmed into one of four possible states {$2^6=(2^2)^3=4^3=64$ states}. In storing a fractional number of bits, a non-binary number of reliable states available in each non-volatile memory cell are utilized to store data across multiple cells, increasing the storage density of the memory device (e.g., the extra available number of states in each cell can be utilized to store additional data). In doing so, a selected number of bits of data are encoded into the available states of a selected number of associated non-volatile memory cells, also known as the minimum base number of cells or a memory cell unit. For example, if the three MLC cells can each reliably store 6 states (Vt ranges/logic windows), as a group (e.g., an associated unit of cells) they can store $6^3=216$ possible unique states. 216 states will easily allow 7 bits of binary data to be mapped into them {7 bits of data means $2^7=128$ states required}. It is noted that, as with single memory cell MLC encoding, the mapping of binary digits (e.g., bits) does not have to completely utilize all available states of the memory cell group. This allows the selected number of bits to be more conveniently mapped/encoded in to the available number of cell states in the grouping of associated memory cells. Applicant further notes that any memory cell states unutilized for data storage (such as the 216−128=88 states remaining in the three MLC cells of the above example) can, in one embodiment, be utilized to increase margins between the utilized valid states, pre-adjust for disturb effects or data encoding (PRML/Trellis/LDPC/Turbo/etc.) or utilized for the storage of error correction data and/or memory device overhead data.

A tradeoff of this approach is as the data is encoded in the available states of the selected base number memory cells, instead of an integer number of bits being stored in each individual cell, a non-integer number of bits may be stored in each cell, meaning that multiple cells must be read to decode the stored data. In addition, the stored data has an increased vulnerability to disturb and errors due to closer margins and less redundancy in data states.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

CONCLUSION

A memory device and programming and/or reading process has been described that programs and/or reads the cells in the memory array with higher threshold voltage resolution than required. In programming non-volatile memory cells, this allows a more accurate threshold voltage placement during programming and enables pre-compensation for program disturb from the subsequent programming of adjacent memory cells by allowing the threshold voltage to be programmed in fine steps within the selected state/logic window/threshold voltage range, such that the program disturb induced by the programming of the subsequence memory cells places the cell at or near its final selected threshold voltage value, increasing the accuracy of any subsequent read or verify operation on the cell. In reading/sensing memory cells, the increased threshold voltage resolution/granularity allows more accurate interpretations of the actual programmed state of the memory cell and also enables more effective use of data encoding and decoding techniques such as convolutional codes where additional granularity of information is used to make soft decisions reducing the overall error rate of the memory. The architecture enables other decoding techniques such as PRML, Trellis Code Modulation and other advanced codes such as LDPC and Turbo codes which utilize probabilistic decoding techniques to achieve optimal decoding, thereby reducing the overall error rate of the memory.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory, comprising:
    programming a selected memory cell of the memory to correspond to a selected state of a number of logic window states utilizing a selected programming threshold voltage level of a number of programming threshold voltage levels;
    wherein the number of logic window states is determined by dividing a usable threshold voltage range of the memory cell into a number of threshold voltage ranges; and
    wherein the number of programming threshold voltage levels is determined by dividing the usable threshold voltage range of the memory cell into the number of programming threshold voltage ranges, each having a corresponding nominal threshold voltage level, where the number of programming threshold voltage ranges is greater than the number of logic window states of the memory cell.

2. The method of claim 1, wherein programming a selected memory cell to correspond to a selected state of the number of logic window states utilizing a selected programming threshold voltage range further comprises programming the selected memory cell with M+N bits of data, where M is user data and equal to the defined number of logic window states and N is an additional number of program data bits that select the programming threshold voltage range to be programmed.

3. The method of claim 1, further comprising selecting the programming threshold voltage range to be programmed to compensate the selected state of the number of logic window states for a predicted program disturb effect.

4. The method of claim 1, further comprising selecting the programming threshold voltage range to be programmed in accordance with probabilistic encoding and/or decoding techniques.

5. The method of claim 4, wherein selecting the programming threshold voltage range to be programmed in accordance with probabilistic encoding and/or decoding techniques further comprises selecting the programming threshold voltage range to be programmed in accordance to one of convolutional code, partial response maximum likelihood (PRML), low-density parity check (LDPC), Turbo, and Trellis modulation encoding and/or decoding.

6. The method of claim 1, further comprising:
    accessing a selected memory cell of the memory and determining a nominal sensing threshold voltage level state associated with the threshold voltage of the memory cell;
    wherein a number of nominal sensing threshold voltage levels is determined by dividing the usable threshold voltage range of the selected memory cell into a number of sensing ranges, each of the sensing ranges having a corresponding nominal sensed threshold voltage level; and
    wherein the number of sensing threshold voltage ranges is greater than the number of logic window states of the selected memory cell.

7. The method of claim 1, wherein the memory is a NAND architecture non-volatile memory.

8. The method of claim 1, further comprising one of communicating program data in one of an analog data signal and a digital data signal to the memory.

9. A method of operating a memory, comprising:
   accessing one or more selected memory cells and determining a nominal sensing threshold voltage level state associated with a programmed threshold voltage of each memory cell;
   wherein a number of nominal sensing threshold voltage levels is determined by dividing a usable threshold voltage range of each of the one or more selected memory cells into a number of sensing ranges, each of the sensing ranges having a corresponding nominal sensed threshold voltage level; and
   wherein the number of sensing threshold voltage ranges is greater than a number of logic window states of each of the one or more selected memory cells.

10. The method of claim 9, wherein dividing the usable threshold voltage range of each of the one or more selected memory cells into a number of sensing ranges, each of the sensing ranges having a corresponding nominal sensed threshold voltage level, further comprises dividing the usable threshold voltage range of each of the one or more selected memory cells into $2^{M+L}$ sensing ranges, where M is a number of bits of user data and equal to the number of logic window states, and L is an additional number of sensing data bits that corresponding to the number of nominal sensing threshold voltage levels.

11. The method of claim 9, wherein accessing one or more selected memory cells and determining a nominal sensing threshold voltage level state associated with the programmed threshold voltage of each memory cell further comprises decoding the determined nominal sensing threshold level state with one of convolutional code, partial response maximum likelihood (PRML), low-density parity check (LDPC), Turbo, and Trellis modulation decoding.

12. The method of claim 9, further comprising:
   programming a selected memory cell of the memory to correspond to a selected state of the number of logic window states utilizing a selected programming threshold voltage level of a number of programming threshold voltage levels;
   wherein the number of programming threshold voltage levels is determined by dividing the usable threshold voltage range of each of the one or more selected memory cells into a number of programming threshold voltage ranges, each having a corresponding nominal threshold voltage level, where the number of program threshold voltage ranges is greater than the number of logic window states of the memory cell.

13. The method of claim 12, wherein the number of programming threshold voltage levels is less than the number of nominal sensing threshold voltage levels.

14. The method of claim 9, further comprising one of communicating program data in one of an analog data signal and a digital data signal to the memory.

15. A non-volatile memory, comprising:
   a non-volatile memory array having a plurality of non-volatile memory cells; and
   a control circuit;
   wherein the non-volatile memory is adapted to program M+N bits of program data in each memory cell of a first number of non-volatile memory cells in a programming operation, where M is a number of user data bits stored in a defined number of threshold voltage logic window ranges of the memory cell and N is a number of additional programming ranges; and
   wherein the non-volatile memory is adapted to sense M+L bits of read data from each memory cell of a second number of non-volatile memory cells in a read operation, where M is the number of user data bits being read from the defined number of threshold voltage logic window ranges of the memory cell and L is a number of additional nominal sensing voltage ranges being sensed in the read operation.

16. The non-volatile memory of claim 15, wherein the non-volatile memory is further adapted to communicate one of an analog voltage level data signal representing the threshold voltage (Vt) read from or to be programmed to a memory cell and a digital data signal representing the threshold voltage (Vt) read from or to be programmed to a memory cell.

17. The non-volatile memory of claim 15, wherein the non-volatile memory is further adapted to select the programming range defined by of the N bits of the M+N bits being programmed in each cell of the first number of selected cells to compensate a threshold voltage logic window range selected by the M bits of user data for a predicted program disturb effect.

18. The non-volatile memory of claim 15, wherein the non-volatile memory is further adapted to decode M+L bits of read data from each memory cell of a second number of non-volatile memory cells with one of convolutional code, partial response maximum likelihood (PRML), low-density parity check (LDPC), Turbo, and Trellis modulation decoding.

19. A method of operating a memory, comprising:
   grouping two or more memory cells into an associated unit of memory cells; and
   programming data into a number of defined threshold voltage logic window states of each of the two or more memory cells of the associated unit of memory cells;
   wherein a usable threshold voltage range of one or more memory cells of the associated unit of memory cells is divided into a non-binary number of defined threshold voltage logic window states; and
   wherein the programmed data is stored across the associated unit of memory cells by being encoded into a total number of available threshold voltage logic window states in the associated unit of memory cells.

20. The method of claim 19, further comprising reading data from the associated unit of memory cells by sensing the programmed threshold logic window states of each of the two or more memory cells of the associated unit of memory cells and decoding the stored data from the programmed threshold logic window states.

21. The method of claim 19, further comprising:
   dividing the threshold voltage range of each memory cell of the plurality of non-volatile memory cells into a number of programming threshold voltage levels, wherein the number of program threshold voltage levels is greater than the defined number of logic window states in each memory cell of the plurality of non-volatile memory cells; and
   programming a selected memory cell of the plurality non-volatile memory cells of the array to correspond to a selected state of the defined number of threshold voltage logic window states utilizing a selected programming threshold voltage level.

22. The method of claim 19, further comprising:
dividing the threshold voltage range of the plurality of non-volatile memory cells of the non-volatile memory array into a number of sensing threshold voltage levels, wherein the number of sensing threshold voltage levels is greater than the defined number of threshold voltage logic window states of each memory cell of the plurality of non-volatile memory cells; and
accessing a selected memory cell of the plurality of non-volatile memory cells and sensing a sensing threshold voltage level state associated with the programmed threshold voltage of the memory cell, wherein a resolution granularity of the number of sensing threshold voltage levels is greater than a resolution granularity of the number of programming threshold voltage levels.

23. The method of claim 19, wherein the non-binary number of defined threshold voltage logic window states is the maximum number of defined threshold windows that can be reliably stored and retrieved from the memory cell.

24. The method of claim 19, wherein the defined threshold voltage logic window states that are unused for user data storage in the associated unit of memory cells are utilized to store overhead data.

25. A non-volatile memory, comprising:

a non-volatile memory array having a plurality of non-volatile memory cells; and a control circuit;

wherein the non-volatile memory is adapted to:

associate a plurality of associated groups of memory cells, each associated group of memory cells having two or more non-volatile memory cells, wherein a threshold voltage range of each associated group of memory cells is divided into a non-binary number of defined threshold voltage logic window states, and program data into the non-binary number of defined threshold voltage logic window states of the two or more memory cells of a selected associated group of memory cells, wherein the programmed data is stored across the associated group of memory cells by being encoded into a total number of available threshold voltage logic window cell states in the associated group of memory cells.

* * * * *

UNITED STATES PATENT AND TRADEMARK OFFICE
CERTIFICATE OF CORRECTION

PATENT NO. : 7,633,798 B2  Page 1 of 1
APPLICATION NO. : 11/943916
DATED : December 15, 2009
INVENTOR(S) : Vishal Sarin et al.

It is certified that error appears in the above-identified patent and that said Letters Patent is hereby corrected as shown below:

In column 22, line 21, in claim 17, delete "defined by of the N bits" and insert -- defined by the N bits --, therefor.

Signed and Sealed this

Thirtieth Day of March, 2010

David J. Kappos
*Director of the United States Patent and Trademark Office*